United States Patent [19]
Fillion et al.

[11] Patent Number: 5,637,922
[45] Date of Patent: Jun. 10, 1997

[54] WIRELESS RADIO FREQUENCY POWER SEMICONDUCTOR DEVICES USING HIGH DENSITY INTERCONNECT

[75] Inventors: Raymond A. Fillion, Schenectady; Otward M. Mueller, Ballston Lake; James F. Burgess, Schenectady, all of N.Y.

[73] Assignee: General Electric Company, Schenectady, N.Y.

[21] Appl. No.: 192,533

[22] Filed: Feb. 7, 1994

[51] Int. Cl.⁶ .......................... H01L 23/34; H01L 23/053
[52] U.S. Cl. .......................... 257/728; 257/691; 257/700; 257/776
[58] Field of Search ........................... 257/691, 728, 257/275, 401, 341, 700, 776

[56] References Cited

U.S. PATENT DOCUMENTS

| | | | |
|---|---|---|---|
| 3,911,553 | 10/1975 | Burgess et al. | 257/758 |
| 4,206,469 | 6/1980 | Hanes et al. | 257/401 |
| 4,456,888 | 6/1984 | Ayasli | 330/277 |
| 4,783,695 | 11/1988 | Eichelberger et al. | 257/758 |
| 4,891,686 | 1/1990 | Krausse, III | 257/728 |
| 4,894,115 | 1/1990 | Eichelberger et al. | 257/758 |
| 5,206,712 | 4/1993 | Kornrumpf et al. | 257/728 |
| 5,331,203 | 7/1994 | Wojnarowski et al. | 257/698 |
| 5,336,928 | 8/1994 | Neugebauer et al. | 257/758 |
| 5,418,394 | 5/1995 | Hertrich | 257/401 |

*Primary Examiner*—Mahshid Saadat
*Assistant Examiner*—T. M. Arroyo
*Attorney, Agent, or Firm*—Ann M. Agosti; Marvin Snyder

[57] ABSTRACT

A power device component package includes a substrate supporting a drain lead, a source lead, and a gate lead. Each of the leads comprises an electrically conductive material having a thickness sufficient to form a high current contact. A power device component with component pads has an electrically conductive backside supported by and electrically coupled to the drain lead. A dielectric layer overlies at least portions of the component, the source lead, and the gate lead and has a plurality of vias therein aligned with predetermined ones of the component pads and predetermined portions of the source and gate leads. A pattern of electrical conductors extends through selected ones of the vias, with a first portion of the pattern coupling selected ones of the component pads to the source lead and a second portion of the pattern coupling at least one other of the component pads to the gate lead.

12 Claims, 10 Drawing Sheets

WIRELESS RADIO FREQUENCY POWER SEMICONDUCTOR DEVICES USING HIGH DENSITY INTERCONNECT

BACKGROUND OF THE INVENTION

1. Field of the Invention

This invention relates generally to packaging for power device components, and, more particularly, to packaging including dielectric overlays supporting electrical conductors which couple portions of a power device component to external high current contact leads.

2. Description of the Related Art

Wire bonding of semiconductor power device components, such as 200 to 1200 volt IGBTs (integrated gate bipolar transistors) and MOSFETs (metal oxide field effect transistors), introduces inductances which significantly reduce the usable frequency range of the components. The inductances especially limit the conversion efficiency of Class E and Class D amplifiers at high current levels.

Furthermore, commercially available high-frequency, high voltage power devices are not sufficient for all design requirements. Many manufacturers offer up to 1000 volt MOSFETs in low-frequency packages such as the TO-247 standard or the DE375 series manufactured by Directed Energy, Inc. For higher frequency (above 1 MHz) and very high frequency (above 30 MHz) applications, the highest voltages available are 120 volts (60 amperes) from Motorola Corporation MOSFETs such as the MRF154-157 series, or 180 volts (16 amperes) from Hitachi Corporation's 2SK1575 MOSFET series. high-frequency power device components would be especially useful for ground heating as well as magnetic resonance imaging power amplifiers.

SUMMARY OF THE INVENTION

Accordingly, one object of the invention is to provide a high-frequency, high voltage power device package with low inductance and low thermal resistance, and a method of fabricating such package.

The present invention eliminates the need for wire bonding of power device components and structures by applying thin film polymer/copper interconnect techniques to the packaging of such structures.

Briefly, in accordance with a preferred embodiment of the invention, a power device component package comprises a substrate supporting a drain lead, a source lead, and a gate lead. Each of the leads comprises an electrically conductive material having a thickness sufficient to form a high current contact. A power device component with component pads has an electrically conductive backside supported by and electrically coupled to the drain lead. A dielectric layer overlies at least portions of the component, the source lead, and the gate lead and has a plurality of vias therein aligned with predetermined ones of the component pads and predetermined portions of the source and gate leads. A pattern of electrical conductors extends through selected ones of the vias, with a first portion of the pattern coupling selected ones of the component pads to the source lead and a second portion of the pattern coupling at least one other of the component pads to the gate lead.

In accordance with another preferred embodiment of the invention, a power device component package comprises an electrically conductive drain lead and a power device component with component pads and having an electrically conductive backside supported by and electrically coupled to the drain lead. A dielectric layer overlies at least a portion of the component and has a plurality of vias therein aligned with predetermined ones of the component pads. A pattern of electrical conductors extends through selected ones of the vias, with a first portion of the pattern coupling selected ones of the component pads and a second portion of the pattern contacting at least one other of the component pads. A layer of solder couples a source lead to the first portion of the pattern of electrical conductors. A layer of solder couples a gate lead to the second portion of the pattern of electrical conductors.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF PREFERRED EMBODIMENT OF THE INVENTION

Figure 1:
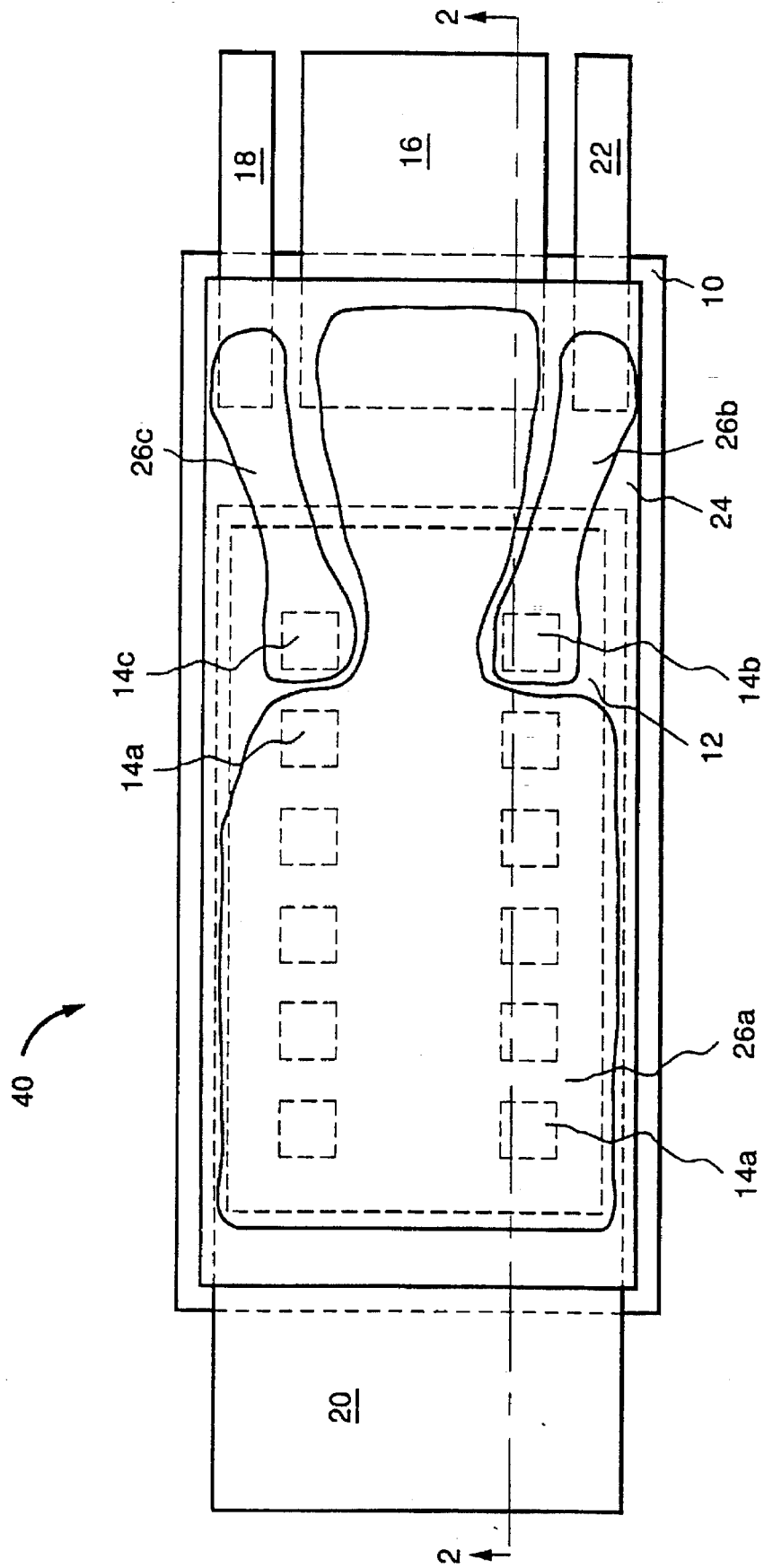
FIGS. 1–2 are top and sectional side views, respectively, of one embodiment of a power device component package of the present invention.
Figure 2:
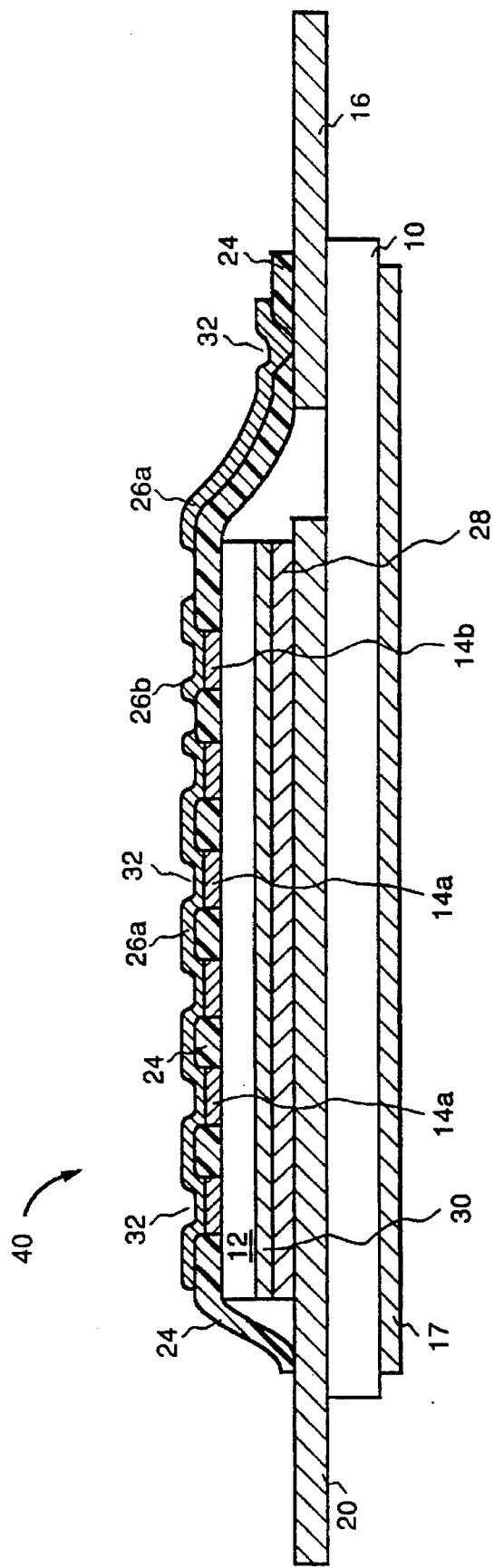

FIG. 1 is a top view and FIG. 2 is a sectional side view of one embodiment of a power device component package 40 of the present invention. A substrate 10, which provides the support of package 40 in this embodiment, may comprise a ceramic material such as beryllium oxide (BeO), aluminum nitride (AlN), or aluminum oxide ($Al_2O_3$) with a thickness of 20–80 mils, for example. Substrate 10 can support backside metallization 17, as shown in FIG. 2, which facilitates attachment of power device component package 40 to a metallized heat sink (not shown) with standard solder, eutectic bonding, adhesive bonding, or thermal grease.

Substrate 10 also supports an electrically conductive drain lead 20, an electrically conductive source lead 16, and an electrically conductive gate lead 18. Preferably the substrate also supports an electrically conductive Kelvin lead 22 to allow measurement of resistance and voltage of a completed package 40. In one embodiment, each of the leads, as well as backside metallization 17, comprises direct bond copper, such as a copper sheet bonded with an oxide bond to a ceramic substrate through a high temperature process as described, for example, in Burgess et al., U.S. Pat. No. 3,911,553, issued Oct. 14, 1975. The leads must have thicknesses (approximately 2 to 20 mils) that allow the leads to act as high current contacts which can handle currents in the range of 10–100 amperes.

A power device component 12 having component pads including source component pads 14a, an optional Kelvin component pad 14b, and a gate component pad 14c, and having a drain contact, shown in FIG. 2 as electrically conductive backside 30, is positioned backside down on drain lead 20. In one embodiment, the power device component is attached to the drain lead with solder 28. Power device component 12 may comprise any appropriate semiconductor power device including MOSFETs and IGBTs, for example. The material of the conductive backside typically comprises aluminum, gold, or a solderable metal.

After component 12 is situated on the drain lead, a polymeric dielectric layer 24 is applied over the component and the electrically conductive leads 16, 18, 20, and 22. Dielectric layer 24 may comprise, for example, a polyimide material such as Kapton polyimide (Kapton is a trademark of E. I. dupont de Nemours and Co., Wilmington, Del.) having a layer of Ultem® polyetherimide (Ultem is a trademark of General Electric Company, Pittsfield, Mass.) to provide adhesion to the component and leads. Vias 32 (not shown in FIG. 1) are then provided by removing portions of dielectric layer 24 from above at least a portion of selected component pads 14a14c and selected areas of source lead 16, gate lead 18, and Kelvin lead 22. If the component pads are large, the vias can also be large or several vias can be provided for each pad. A method of scanning the surface of a dielectric layer with a high energy continuous wave laser to create vias is disclosed in Eichelberger et al., U.S. Pat. No. 4,894,115, issued Jan. 16, 1990.

A pattern of electrical conductors represented by source conductor sheet 26a, Kelvin conductor sheet 26b, and gate conductor sheet 26c is then applied. Preferably, an electrical conductor is initially applied by sputtering titanium, sputtering copper, and electroplating copper, for example, to a thickness of approximately 0.5–5 mils over dielectric layer 24 and through vias 32. The pattern is then formed by selectively etching portions of the electrical conductor through a photoresist mask (not shown), for example, and leaving other portions of the conductor in desired locations. Source component pads 14a are coupled to source lead 16 through the portion of the pattern of electrical conductors represented as source conductor sheet 26a, and gate component pad 14c is coupled to gate lead 18 through gate conductor sheet 26c. Preferably, a Kelvin component pad 14b is coupled to Kelvin lead 22 through Kelvin conductor sheet 26b. The surface area of the pattern of electrical conductors is maximized to enhance electrical conductance of the package.

After the formation of the conductor sheets, any undesired remaining portion of dielectric layer 24, can be removed by laser ablation or wet chemical etching.

Then package 40 can be encased in a plastic coating (not shown) such as epoxy or polyimide resin, for example, in preparation for placement in a finished device. If desired, a plurality of component packages can be formed simultaneously on a single substrate and cut into individual units either before or after the plastic encasing.

Figure 3:
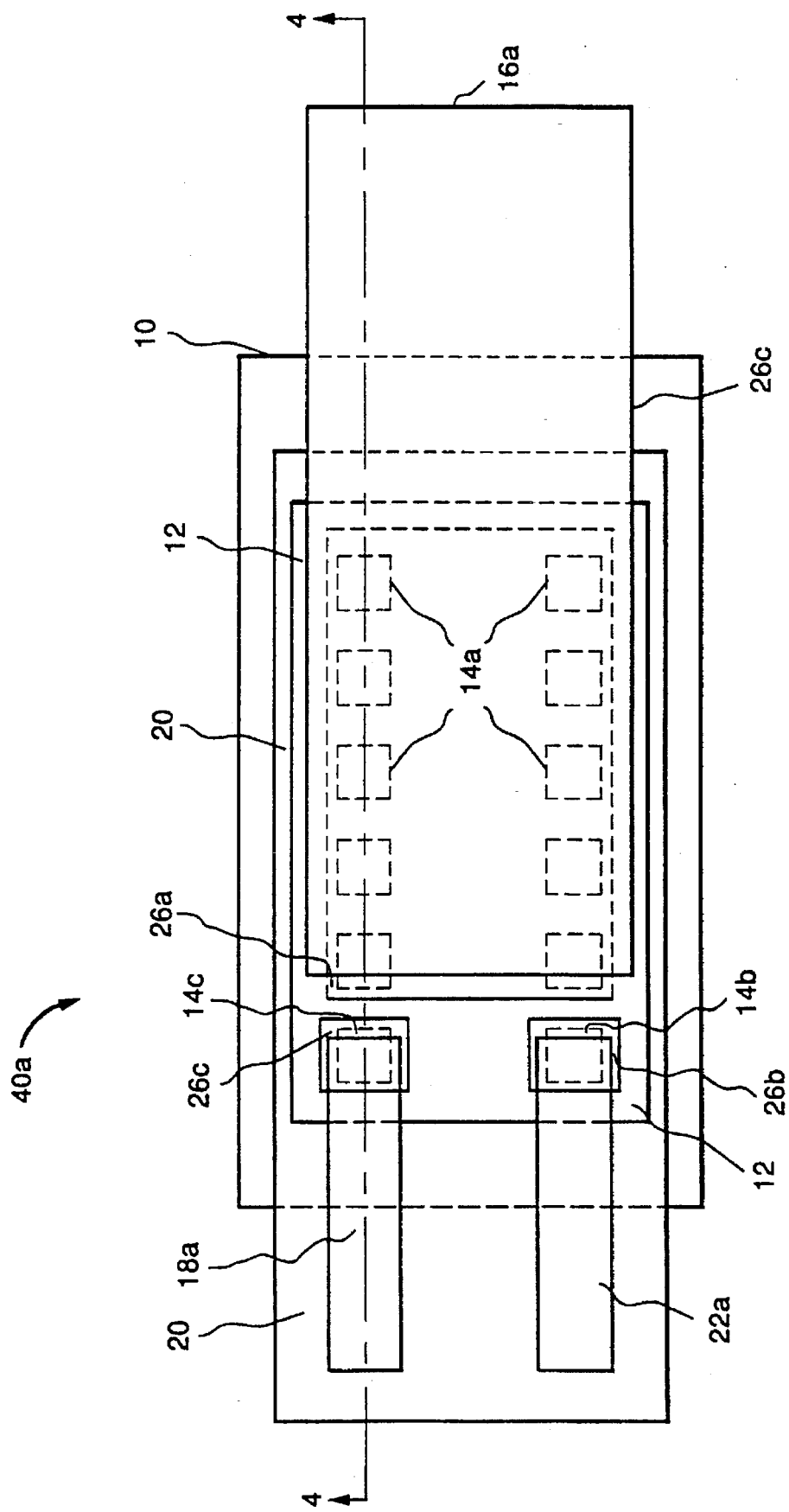
FIGS. 3–4 are top and sectional side views, respectively, of another embodiment of a power device component package of the present invention.
Figure 4:
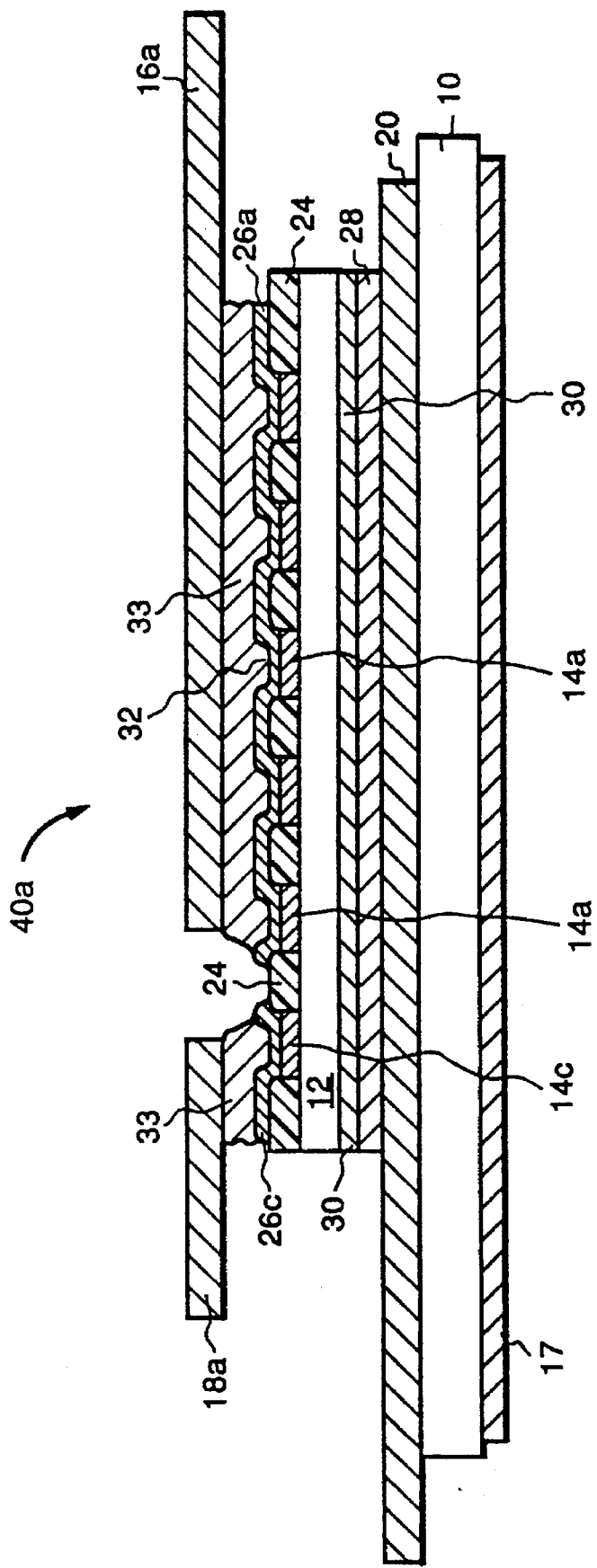

FIGS. 3–4 are top and sectional side views, respectively, of another embodiment of a power device component package 40a of the present invention. This package is similar to the package described with respect to FIGS. 1–2, except that dielectric layer 24 is not applied over conductive leads 16, 18, and 22 (for simplicity of illustration, dielectric layer 24 is not shown in FIG. 3). In this embodiment, the dielectric layer is applied only over power device component 12. Vias 32 are formed through the dielectric layer to at least a portion of selected component pads 14a14c. Metallization and patterning are done as described with respect to FIGS. 1–2, except that no connections are made to leads 16, 18, and 22.

Power device component 12 is soldered with solder 28 to electrically conductive drain lead 20. Dielectric layer 24 and conductor sheets 26a–26c are applied to component 12 either prior to or after the soldering of component 12 to drain lead 20. Solder 33 is applied via standard hybrid processes such as solder paste screening or solder preform placement on at least a portion of conductor sheets 26a–26c, or applied by standard solder plate or dip processes to component leads 16a, 18a, and 22a, or applied to both the conductor sheets and the component leads.

Electrically conductive leads 16a, 18a, and 22a are subsequently electrically attached to the conductor sheets 26a–26c by reflow solder, with source lead 16a attached to source conductor sheet 26a, gate lead 18a attached to gate conductor sheet 26c, and Kelvin lead 22a attached to Kelvin conductor sheet 26b. The conductive leads may comprise a metal such as copper or Kovar, or a metal combination such as either nickel-plated or gold-plated copper. For high power applications the source lead is designed to be as thick as practical, about 10 to 50 mils, to minimize electrical resistance of the lead. As described for the embodiment shown in FIGS. 1–2, component package 40a can be encapsulated in plastic to facilitate further assembly steps.

In the embodiment of FIGS. 3 and 4, substrate 10 may be omitted when the component is not required to be mounted to a heat sink, such as when component package 40a is cryogenically cooled by immersion into a low temperature liquified gas such as liquid nitrogen or liquid helium.

Figure 5:
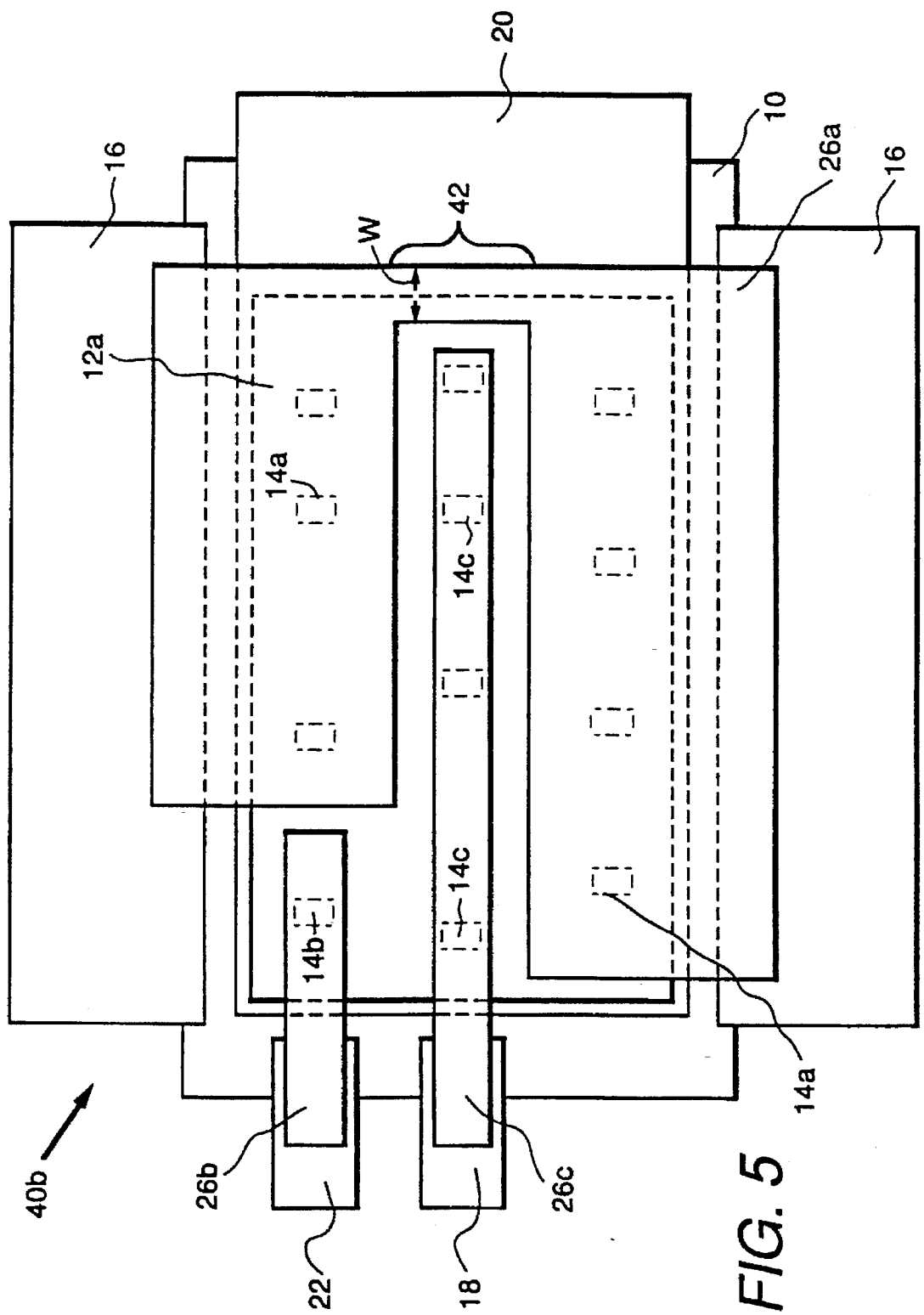
FIG. 5 is a top view of yet another embodiment of a power device component package of the present invention.

FIG. 5 is a top view of still another embodiment of a power device component package 40b of the present invention. Not all power device components 12 have component pads corresponding to gates and Kelvins situated neatly in corners, as shown in FIGS. 1–4, and thus providing for easy patterning of conductor sheets 26a–26c. A component 12a, which is shown in FIG. 5, has the gate component pads 14c positioned in a middle row of the component (for simplicity, dielectric layer 24 is not shown in FIG. 5). In this configuration, a portion 42 of the source conductor sheet is necessarily extremely thin, as indicated by dimension W, requiring a heavy current to pass through a small volume in that region of the device. The use of two source leads 16, as shown in FIG. 5, is one approach to reducing the current flow through thin portion 42 of source conductor sheet 26a.

Figure 6:
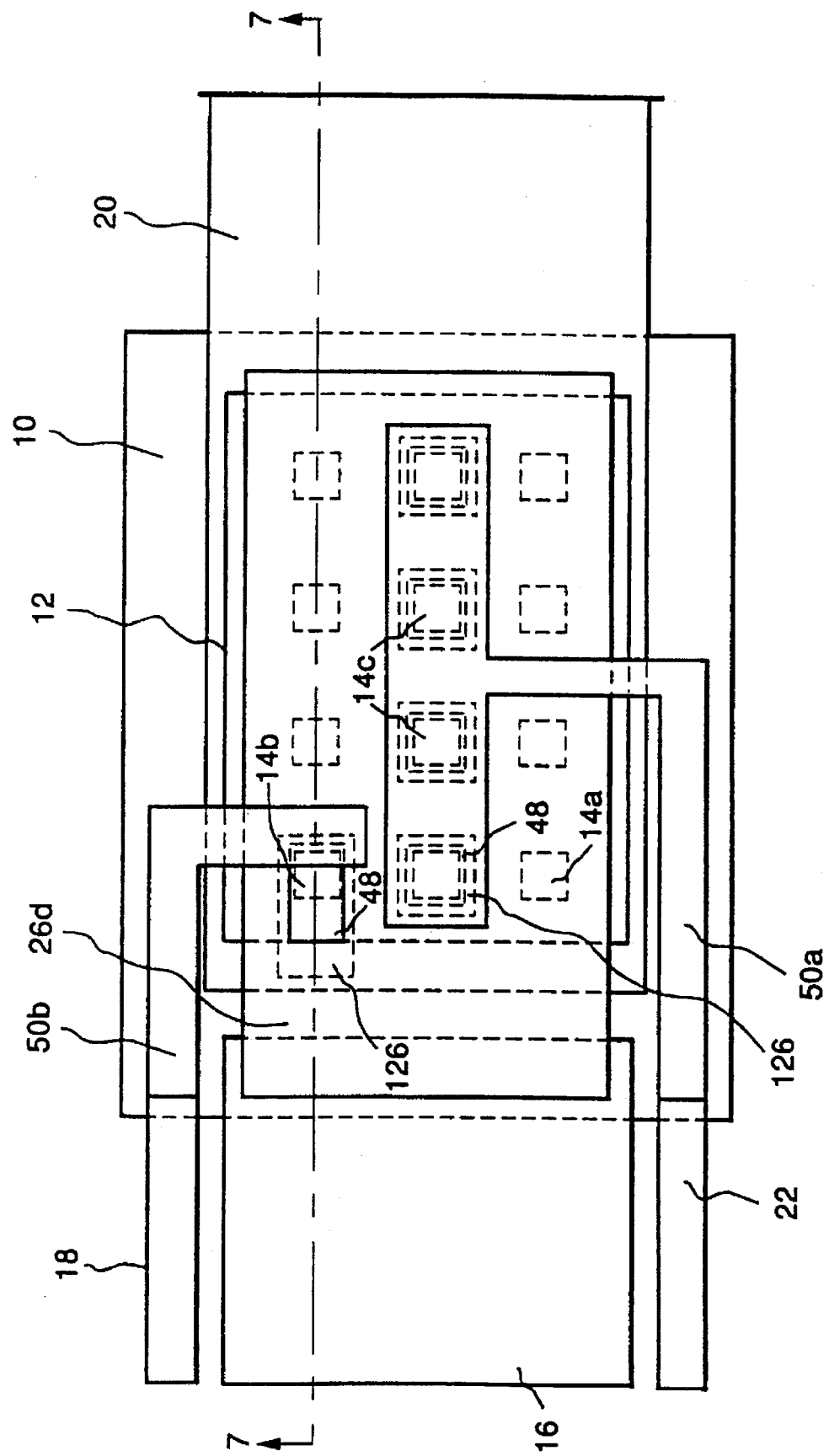
FIGS. 6–7 are top and sectional side views, respectively, of still another embodiment of a power device component package of the present invention.
Figure 7:
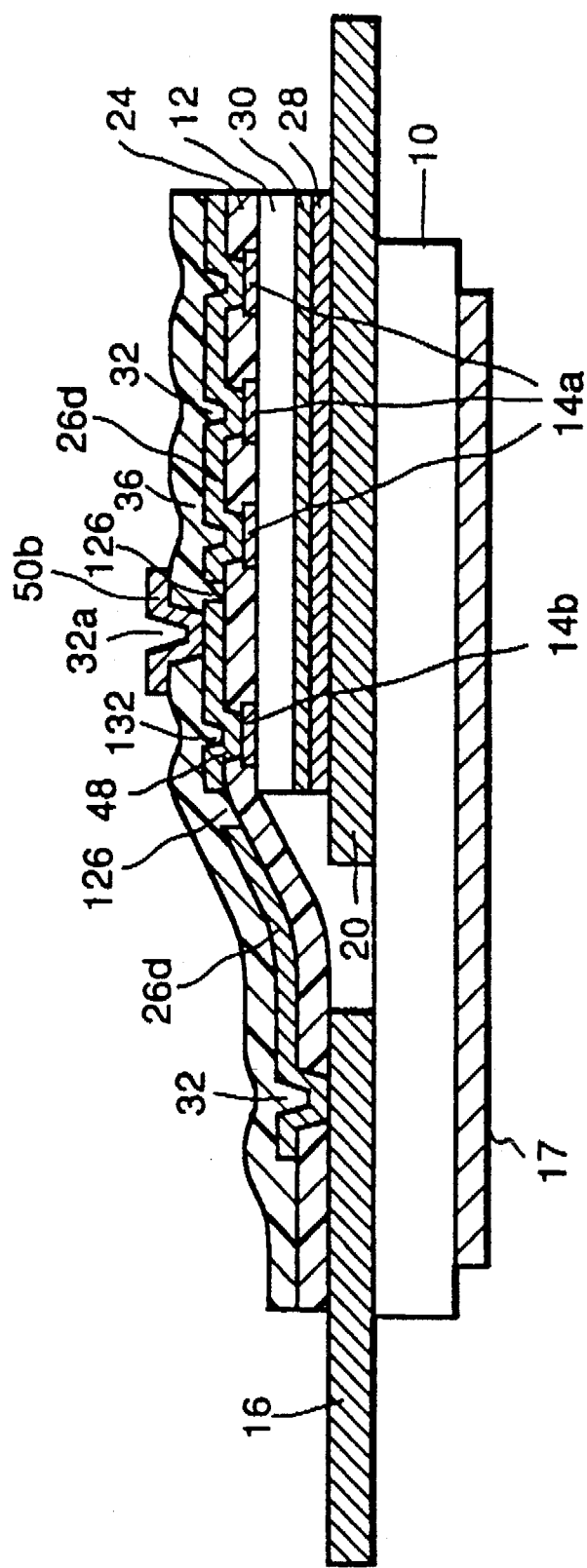

FIGS. 6–7 are top and sectional side views, respectively, of still another embodiment of a power device component package of the present invention. Power device component 12 in FIGS. 6–7 has gate component pads 14c between source component pads 14a. Rather than using multiple source leads as in FIG. 5 though, the gate component pads and Kelvin component pad, if present, can be accessed through vias 32a in an additional dielectric layer 36 situated over dielectric layer 24 and by way of a conductive sheet 26d through vias 132 in dielectric layer 24 (dielectric layer 24 and additional dielectric layer 36 are not shown in FIG. 6, for simplicity of illustration).

Preferably, in this embodiment, vias 132 (shown in FIG. 7) are formed, as in the previously-described embodiments, over the gate and Kelvin component pads and are metallized (as shown by a middle pattern of electrical conductors 48 in FIG. 7) at the same time that vias 32 are formed and metallized with a source conductor sheet 26d over the source component pads. Source conductor sheet 26d has gaps 126 which leave spaces for middle pattern of electrical conductors 48. Additional dielectric layer 36 is then applied over dielectric layer 24 and at least a portion of the gate lead, at least one additional via 32a is formed and aligned with a predetermined portion of the middle pattern, and at least one other additional via is formed and aligned with a predetermined portion of the gate lead. The at least one other additional via to the gate lead in one embodiment (in which dielectric layer 24 need not extend over the gate lead) can be formed through additional dielectric layer 36 alone or, in another embodiment (in which additional dielectric layer 36 overlies dielectric layer 24 over the gate lead), can be formed through both additional dielectric layer 36 and underlying dielectric layer 24.

Next, a second pattern of electrical conductors extending through via 32a is applied and patterned to form conductor sheets 50a and 50b on additional dielectric layer 36 to correspond to predetermined portions of the middle pattern of electrical conductors 48. In this embodiment as shown in FIG. 6, gate conductor sheet 50a is patterned to connect gate component pads 14c to gate lead 22 through vias 32a (via 32a shown in FIG. 7), and Kelvin conductor sheet 50b is similarly patterned to connect Kelvin component pad 14b to Kelvin lead 18.

More complex devices with more than four terminals can be interconnected with one or more additional dielectric layers having vias and covered by selected patterns of electrical conductors which extend through the vias.

Figure 8:
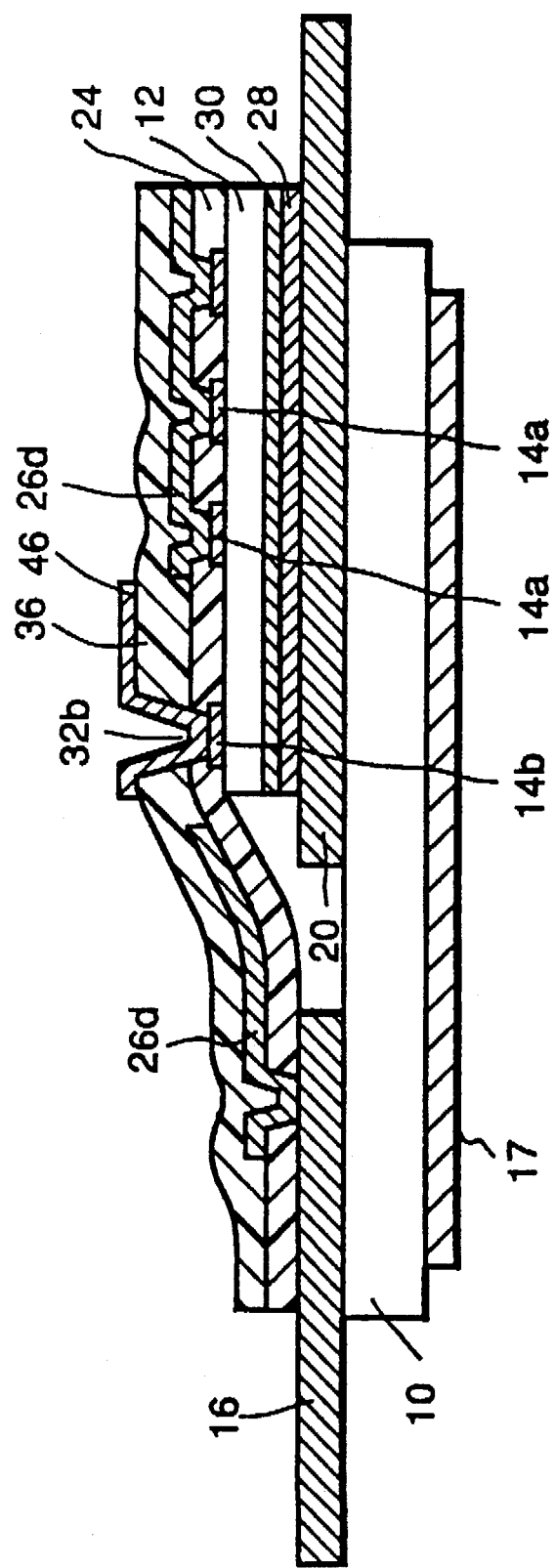
FIG. 8 is a sectional side view similar to that of FIG. 7, showing another embodiment of a power device component package.

FIG. 8 is a sectional side view similar to that of FIG. 7, showing another embodiment of a power device component package. Unlike the embodiment shown in FIG. 7, via 132 to component pad 14b is not formed in dielectric layer 24 prior to application of additional dielectric layer 36. Instead, one deep via 32b is formed through both dielectric layer 24 and additional dielectric layer 36 simultaneously, followed by metallization of the via and additional dielectric layer to form a second pattern of electrical conductors 46. This technique simplifies metallization patterning, but requires fabrication of deeper vias.

Figure 9:
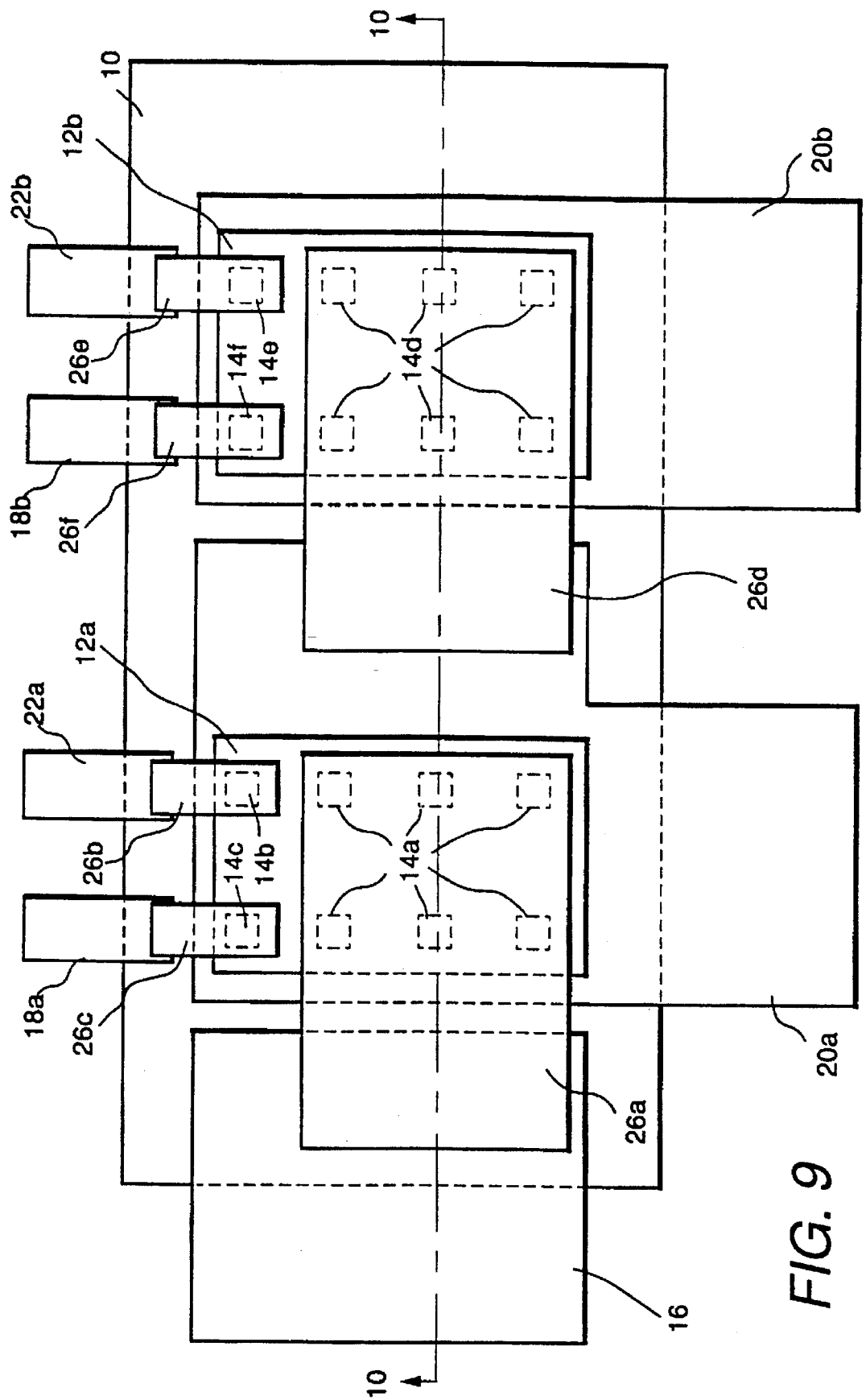
FIGS. 9–10 are top and sectional side views, respectively, of a package of power device components of the present invention.
Figure 10:
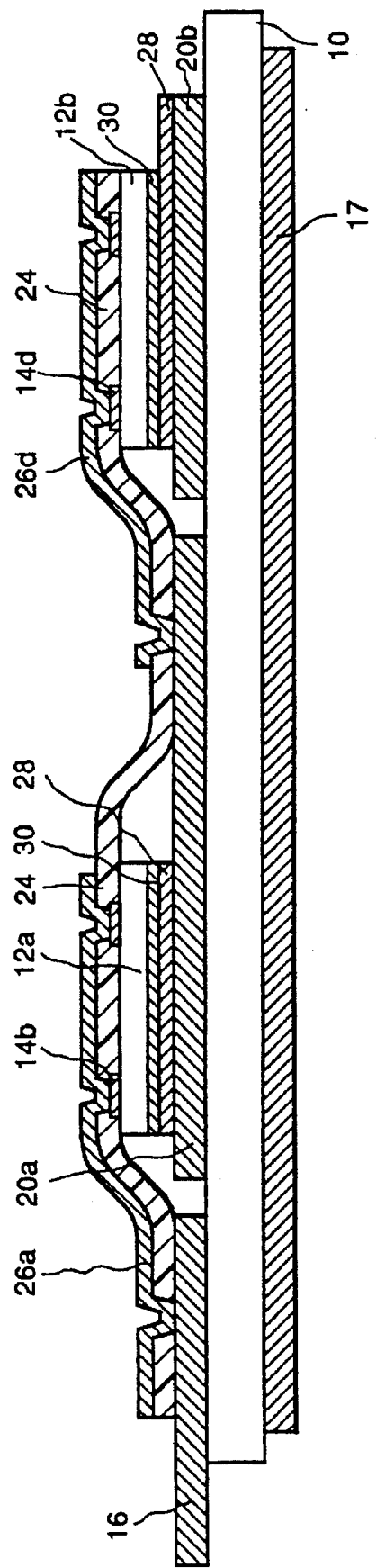

FIGS. 9-10 are top and sectional side views, respectively, of a package of power device components of the present invention similar to those shown in FIGS. 1-2 except that two power components, 12a and 12b, are present. Power components 12a and 12b are shown coupled in a half-bridge configuration with a source conductor sheet 26d of component 12b electrically connecting source component pads 14d to the drain lead 20a of component 12a. Many other useful structures can be easily implemented, including a full bridge, three-phase-bridge, and parallel pair circuits, for example. In addition, other devices that are generally used in such power circuits such as diodes, capacitors, resistors, and input protection devices can be similarly interconnected with the power devices in this invention.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A power device component package, comprising:
    a substrate comprising insulative material;
    a drain lead, a source lead, and a gate lead, each of said leads being supported by said substrate and comprising an electrically conductive material having a thickness sufficient to form a high current contact;
    a power device component having component pads, said component having an electrically conductive backside supported by and electrically coupled to said drain lead;
    a dielectric layer overlying at least portions of said component, said source lead, and said gate lead, said dielectric layer having a plurality of vias therein aligned with predetermined ones of said component pads and predetermined portions of said source and gate leads; and
    a pattern of electrical conductors extending through selected ones of said vias, a first portion of said pattern coupling selected ones of said component pads to said source lead, and a second portion of said pattern coupling at least one other of said component pads to said gate lead.

2. The power device component package of claim 1, wherein said source, gate, and drain leads comprise direct bond copper and said dielectric layer comprises a polyimide material.

3. The power device component package of claim 2, wherein said substrate comprises material selected from the group consisting of beryllium oxide and aluminum nitride.

4. The power device component package of claim 3, further including metallization on at least a portion of the surface of said substrate opposite a surface of said substrate supporting said leads.

5. A power device component package, comprising:
    an electrically conductive drain lead;
    a power device component having component pads, said component having an electrically conductive backside supported by and electrically coupled to said drain lead;
    a dielectric layer overlying at least a portion of said component, said dielectric layer having a plurality of vias therein aligned with predetermined ones of said component pads;
    a pattern of electrical conductors extending through selected ones of said vias, a first portion of said pattern coupling selected ones of said component pads, and a second portion of said pattern contacting at least one other of said component pads;
    an electrically conductive source lead;
    a layer of solder coupling said source lead to said first portion of said pattern of electrical conductors;
    an electrically conductive gate lead, each of said drain, source, and gate leads having a thickness sufficient to form a high current contact; and
    a layer of solder coupling said gate lead to said second portion of said pattern of electrical conductors.

6. The power device component package of claim 5, wherein said source, gate, and drain leads comprise copper having a thickness sufficient to form a high current contact and said dielectric layer comprises a polyimide material.

7. The power device component package of claim 5, further comprising a substrate comprising insulative material and supporting said drain lead.

8. A power device component package, comprising:
    a substrate comprising insulative material;
    a drain lead, a source lead, and a gate lead, each of said leads being supported by said substrate and comprising an electrically conductive material having a thickness sufficient to form a high current contact;
    a power device component having component pads, said component having an electrically conductive backside supported by and electrically coupled to said drain lead;

a dielectric layer overlying at least portions of said component and said source lead, said dielectric layer having a plurality of vias therein aligned with predetermined ones of said component pads and at least a predetermined portion of said source lead; and a first pattern of electrical conductors extending through selected ones of said vias and coupling selected ones of said component pads to said source lead;

a middle pattern of electrical conductors extending through at least one other of said vias and contacting at least one other of said component pads;

an additional dielectric layer over at least a portion of said gate lead, at least a portion of said dielectric layer, and at least a portion of said middle pattern of electrical conductors, said additional dielectric layer and having at least one additional via therein aligned with a predetermined portion of said middle pattern and at least one other additional via therein aligned with a predetermined portion of said gate lead; and a second pattern of electrical conductors extending through said at least one additional via and said at least one other additional via to couple said gate lead and said middle pattern.

9. The power device component package of claim 8, wherein said source, gate, and drain leads comprise direct bond copper, said dielectric layer comprises a polyimide material, and said substrate comprises a ceramic material.

10. A power device component package, comprising:

a substrate comprising insulative material;

a drain lead, a source lead, and a gate lead, each of said leads being supported by said substrate and comprising an electrically conductive material having a thickness sufficient to form a high current contact;

a power device component having component pads, said component having an electrically conductive backside supported by and electrically coupled to said drain lead;

a dielectric layer overlying at least portions of said component and said source lead, said dielectric layer having a plurality of vias therein aligned with predetermined ones of said component pads and at least a predetermined portion of said source lead; and a first pattern of electrical conductors extending through selected ones of said vias and coupling selected ones of said component pads to said source lead;

an additional dielectric layer over at least a portion of said gate lead and at least a portion of said dielectric layer, said additional dielectric layer and said dielectric layer having at least one additional via extending through each of said dielectric layers to another of said chip pads and at least one other additional via therein aligned with a predetermined portion of said gate lead; and a second pattern of electrical conducters extending through said at least one additional via and said at least one other additional via and coupling said another of said chip pads to said gate lead.

11. The power device component package of claim 10, wherein said source, gate, and drain leads comprise direct bond copper, said dielectric layer comprises a polyimide material, and said substrate comprises a ceramic material.

12. A package of power device components, comprising:

a substrate comprising insulative material;

first and second electrically conductive drain leads supported by said substrate;

an electrically conductive source lead supported by said substrate;

first and second electrically conductive gate leads supported by said substrate, each of said drain, source, and gate leads having a thickness sufficient to form a high current contact;

a first power device component having component pads and having an electrically conductive backside supported by and electrically coupled to said first electrically conductive drain lead;

a second power device component having component pads and having an electrically conductive backside supported by and electrically coupled to said second electrically conductive drain lead;

a dielectric layer overlying at least a portion of said first and second components and at least portions of said source lead, said first drain lead, and said first and second gate leads, said dielectric layer having a plurality of vias therein aligned with predetermined ones of said component pads and predetermined portions of said source lead, said first drain lead, and said first and second gate leads; and a pattern of electrical conductors extending through said vias and coupling selected component pads to respective selected ones of said first drain lead, said first and second gate leads, and said source lead.

* * * * *